(12) United States Patent
Matsunaga

(10) Patent No.: US 10,204,741 B2
(45) Date of Patent: Feb. 12, 2019

(54) ELECTRONIC COMPONENT

(71) Applicant: MURATA MANUFACTURING CO., LTD., Kyoto-fu (JP)

(72) Inventor: Minoru Matsunaga, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 234 days.

(21) Appl. No.: 15/244,519

(22) Filed: Aug. 23, 2016

(65) Prior Publication Data

US 2017/0063322 A1 Mar. 2, 2017

(30) Foreign Application Priority Data

Aug. 26, 2015 (JP) .................................. 2015-166913

(51) Int. Cl.
*H01G 4/40* (2006.01)
*H01G 4/012* (2006.01)
(Continued)

(52) U.S. Cl.
CPC ........... *H01G 4/40* (2013.01); *H01F 17/0013* (2013.01); *H01F 27/292* (2013.01);
(Continued)

(58) Field of Classification Search
CPC ............ H01G 4/40; H01G 4/012; H01G 4/30; H01G 4/0085; H01G 4/0012;
(Continued)

(56) References Cited

U.S. PATENT DOCUMENTS 6,950,293 B2 * 9/2005 Anthony ................ H01C 7/123
  361/118
9,312,062 B2 * 4/2016 Kato .................... H01F 17/0013
(Continued)

FOREIGN PATENT DOCUMENTS

JP H01-073909 A 3/1989
JP 2000-252124 A 9/2000
(Continued)

OTHER PUBLICATIONS

Notification of the First Office Action issued by the State Intellectual Property Office of the People's Republic of China dated Nov. 17, 2017, which corresponds to Chinese Patent Application No. 201610707970.4 and is related to U.S. Appl. No. 15/244,519.
(Continued)

*Primary Examiner* — Zeev V Kitov
(74) *Attorney, Agent, or Firm* — Studebaker & Brackett PC

(57) ABSTRACT

An electronic component having a multilayer body that includes a plurality of insulating layers that are stacked on top of one another; a primary coil and a secondary coil that are arranged inside the multilayer body in a stacking direction of the multilayer body; a first ground electrode and a second ground electrode that are provided in the multilayer body and between which the primary coil and the secondary coil are interposed in the stacking direction; and a ground terminal that is connected to the first ground electrode and the second ground electrode. A capacitance is generated between the first ground electrode and the primary coil or the secondary coil and a capacitance is generated between the second ground electrode and the primary coil or the secondary coil.

13 Claims, 11 Drawing Sheets

(51) Int. Cl.
*H01G 4/30* (2006.01)
*H05F 3/04* (2006.01)
*H01F 17/00* (2006.01)
*H01F 27/29* (2006.01)
*H03H 7/01* (2006.01)
*H03H 7/42* (2006.01)
*H01G 4/008* (2006.01)
*H03H 1/00* (2006.01)

(52) U.S. Cl.
CPC ........... *H01G 4/0085* (2013.01); *H01G 4/012* (2013.01); *H01G 4/30* (2013.01); *H03H 7/0107* (2013.01); *H03H 7/427* (2013.01); *H05F 3/04* (2013.01); *H01F 2017/0026* (2013.01); *H01F 2017/0093* (2013.01); *H03H 2001/0085* (2013.01)

(58) Field of Classification Search
CPC ............. H01F 17/0013; H01F 27/0107; H01F 17/292; H01F 3/04; H03H 7/427; H03H 7/0107; H05F 3/04
See application file for complete search history.

(56) References Cited

U.S. PATENT DOCUMENTS

| | | | | |
|---|---|---|---|---|
| 2003/0129957 A1* | 7/2003 | Shingaki | ................... | H03H 7/09 455/307 |
| 2007/0183131 A1* | 8/2007 | Jow | ...................... | H05K 1/0218 361/816 |
| 2010/0182724 A1* | 7/2010 | Ito | ........................ | H03H 7/0107 361/56 |
| 2013/0249661 A1* | 9/2013 | Motomiya | .......... | H01F 17/0013 336/200 |
| 2014/0156720 A1* | 6/2014 | Janakiraman | ......... | H04L 47/122 709/202 |
| 2014/0347773 A1 | 11/2014 | Park et al. | | |

FOREIGN PATENT DOCUMENTS

| | | |
|---|---|---|
| JP | 2004-194170 A | 7/2004 |
| JP | 2005-328468 A | 11/2005 |
| JP | 2009-010729 A | 1/2009 |
| JP | 2009-099930 A | 5/2009 |
| JP | 2011-181512 A | 9/2011 |
| JP | 2012-019443 A | 1/2012 |
| JP | 2012-129665 A | 7/2012 |
| JP | 2014-053765 A | 3/2014 |
| JP | 2014-230278 A | 12/2014 |
| KR | 10-1445741 B1 | 10/2014 |

OTHER PUBLICATIONS

An Office Action; "Notification of Preliminary Rejection," issued by the Korean Intellectual Property Office dated Sep. 20, 2017, which corresponds to Korean Patent Application No. 10-2016-0102360 and is related to U.S. Appl. No. 15/244,519; with English language translation.

An Office Action; "Notice of Reasons for Rejection," issued by the Japanese Patent Office dated Jan. 16, 2018, which corresponds to Japanese Patent Application No. 2015-166913 and is related to U.S. Appl. No. 15/244,519.

* cited by examiner

ELECTRONIC COMPONENT

CROSS REFERENCE TO RELATED APPLICATIONS

This application claims benefit of priority to Japanese Patent Application 2015-166913 filed Aug. 26, 2015, the entire content of which is incorporated herein by reference.

TECHNICAL FIELD

The present disclosure relates to an electronic component that includes a common mode choke coil and a capacitor.

BACKGROUND

An electronic component disclosed in Japanese Unexamined Patent Application Publication No. 2014-53765 and an electronic component disclosed in Japanese Unexamined Patent Application Publication No. 2014-230278 are examples of electronic components of the related art.

In the electronic component disclosed in Japanese Unexamined Patent Application Publication No. 2014-53765, first and second capacitor electrodes are provided above first and second coils that form a common mode filter. Third and fourth capacitor electrodes are provided below the first and second coils. The first capacitor electrode and the third capacitor electrode are connected to the two ends of the first coil. The second capacitor electrode and the fourth capacitor electrode are connected to the two ends of the second coil.

A first ground electrode is provided above the first and second capacitor electrodes. A second ground electrode is provided below the third and fourth capacitor electrodes. Capacitances are generated between the first capacitor electrode and the first ground electrode and between the second capacitor electrode and the first ground electrode. Capacitances are generated between the third capacitor electrode and the second ground electrode and between the fourth capacitor electrode and the second ground electrode.

As illustrated in the equivalent circuit of FIG. 9, a first capacitor electrode 131 and a third capacitor electrode 133 are connected to the two ends of a first coil 121, and a first ground electrode 141 faces the first capacitor electrode 131 and the third capacitor electrode 133. A second capacitor electrode 132 and a fourth capacitor electrode 134 are connected to the two ends of a second coil 122, and a second ground electrode 142 faces the second capacitor electrode 132 and the fourth capacitor electrode 134. In other words, a so-called π-type LC filter structure is formed as an equivalent circuit.

On the other hand, the electronic component disclosed in Japanese Unexamined Patent Application Publication No. 2014-230278 includes first to fourth coils that are sequentially arranged in a stacking direction. The first coil and the third coil are connected to each other through a via conductor and form a primary coil. The second coil and the fourth coil are connected to each other through a via conductor and form a secondary coil. A ground electrode is provided between the second coil and the third coil and capacitances are generated between the ground electrode and the primary and secondary coils.

However, when the above-described electronic components of the related art were manufactured and actually used, the following problems were discovered.

In the electronic component disclosed in Japanese Unexamined Patent Application Publication No. 2014-53765, since an π-type LC filter structure is adopted, it is necessary to have large capacitance in order to realize LC resonance. Consequently, a signal transmission characteristic Sdd21 is poor and signal quality is degraded.

On the other hand, in the electronic component disclosed in Japanese Unexamined Patent Application Publication No. 2014-230278, a ground electrode is arranged between the second coil and the third coil and therefore the ground electrode and a via conductor that have different potentials are located in the same layer. Consequently, electrochemical migration occurs due to the potential difference between the ground electrode and the primary and secondary coils (via conductor).

SUMMARY

Accordingly, the present disclosure addresses the problem of providing an electronic component that suppresses degradation of signal quality and can prevent the occurrence of electrochemical migration.

In order to solve this problem, an electronic component of a preferred embodiment of the present disclosure includes: a multilayer body that includes a plurality of insulating layers that are stacked on top of one another; a primary coil and a secondary coil that are arranged inside the multilayer body in a stacking direction of the multilayer body; a first ground electrode and a second ground electrode that are provided in the multilayer body and between which the primary coil and the secondary coil are interposed in the stacking direction; and a ground terminal that is connected to the first ground electrode and the second ground electrode; a capacitance being generated between the first ground electrode and the primary coil or the secondary coil and a capacitance being generated between the second ground electrode and the primary coil or the secondary coil.

In the electronic component of the preferred embodiment of the present disclosure, the first ground electrode and the second ground electrode are arranged such that the primary coil and the secondary coil are interposed therebetween in the stacking direction and a capacitance is generated between the first ground electrode and the primary coil or the secondary coil and a capacitance is generated between the second ground electrode and the primary coil or the secondary coil.

Thus, as a result of a capacitance being generated between the first ground electrode and the primary coil or the secondary coil and a capacitance being generated between the second ground electrode and the primary coil or the secondary coil, a so-called T-type LC filter structure is formed as an equivalent circuit. Therefore, resonance can be obtained with smaller capacitance values than in the π-type LC filter structure of the related art and a reduction in signal quality can be suppressed by reducing degradation of the signal transmission characteristic Sdd21.

In addition, since the first ground electrode and the second ground electrode are arranged outside the primary coil and the secondary coil, the first and second ground electrodes are not located inside the primary and secondary coils. Therefore, since the first and second ground electrodes and the primary and secondary coils, which are at different potentials, are not located in the same layers, electrochemical migration, which is caused by a potential difference between the first and second ground electrodes and the primary and secondary coils, can be prevented.

In addition, in a preferred embodiment of the electronic component, the first ground electrode faces one of the primary coil and the secondary coil and the second ground electrode faces the other of the primary coil and the secondary coil.

In this preferred embodiment, a capacitance is generated between the first ground electrode and one of the primary coil and the secondary coil and a capacitance is generated between the second ground electrode and the other one of the primary coil and the secondary coil. Thus, good balance can be achieved between the attenuation characteristics of the primary coil and the secondary coil and the overall noise suppression effect can be improved.

Furthermore, in a preferred embodiment of the electronic component, the primary coil includes two coils that are electrically connected to each other, the secondary coil includes two coils that are electrically connected to each other and the two coils of the primary coil and the two coils of the secondary coil are arranged in an alternating manner in the stacking direction.

In this preferred embodiment, since the two coils of the primary coil and the two coils of the secondary coil are arranged in an alternating manner in the stacking direction, stray capacitances inside the primary and secondary coils can be reduced and the electronic component is able to handle high frequencies. In addition, since the capacitances between the coils and ground electrodes can be obtained in an equal and well-balanced manner by using the primary and secondary coils, attenuation can be achieved through appropriate LC resonance.

Furthermore, in a preferred embodiment of the electronic component, the multilayer body includes a non-magnetic body and upper and lower magnetic bodies that vertically sandwich the non-magnetic body therebetween in the stacking direction, and the primary coil and the secondary coil are arranged inside the non-magnetic body.

In this embodiment, the primary coil and the secondary coil are arranged inside the non-magnetic body and the non-magnetic body is vertically sandwiched between the magnetic bodies and therefore the magnetic flux of the coils is concentrated in the upper and lower magnetic bodies. Consequently, magnetic flux that flows around the individual coils is decreased and shared magnetic flux that flows around the primary coil and the secondary coil is increased. Therefore, coupling between the primary coil and the secondary coil can be strengthened and therefore high impedance can be achieved and degradation of the signal transmission characteristic Sdd21 can be reduced.

Furthermore, in a preferred embodiment of the electronic component, the first ground electrode is arranged inside one magnetic body among the upper and lower magnetic bodies and the second ground electrode is arranged inside the other magnetic body among the upper and lower magnetic bodies.

In this preferred embodiment, the first ground electrode is arranged inside one of the upper and lower magnetic bodies and the second ground electrode is arranged inside the other of the upper and lower magnetic bodies. Thus, the first ground electrode and the second ground electrode can be arranged in the magnetic bodies, which are different bodies from the non-magnetic body in which the primary coil and the secondary coil are arranged, and an increase in stress in the non-magnetic body caused by the electrodes being concentrated in the non-magnetic body is relaxed and the occurrence of structural defects and a decrease in reliability can be suppressed.

Furthermore, in a preferred embodiment of the electronic component, the first ground electrode and the second ground electrode are superposed with the primary coil and the secondary coil and are not superposed with an inner diameter part of the primary coil and an inner diameter part of the secondary coil when viewed in the stacking direction.

In this preferred embodiment, the first ground electrode and the second ground electrode are not superposed with an inner diameter part of the primary coil and an inner diameter part of the secondary coil when viewed in the stacking direction. Consequently, magnetic flux of the primary coil and the secondary coil is not blocked by the first ground electrode and the second ground electrode and degradation of characteristics caused by the effect of loss of magnetic flux can be suppressed.

Furthermore, in a preferred embodiment of the electronic component, a pattern of the first ground electrode and a pattern of the second ground electrode have spiral shapes that have the same line widths and line separations as facing coils, which are coils that respectively face the first ground electrode and the second ground electrode, among coils of the primary coil and the secondary coil and the pattern of the first ground electrode and the pattern of the second ground electrode are arranged at such positions as to be superposed with the patterns of the facing coils when viewed in the stacking direction.

In this preferred embodiment, the first ground electrode and the second ground electrode respectively have similar patterns to the facing coils among the coils of the primary coil and the secondary coil when viewed in the stacking direction. Consequently, the surface areas of the first and second ground electrodes can be reduced to the minimum and the capacitances can be efficiently obtained. In addition, since the surface areas of the first and second ground electrodes can be reduced, the generation of stress caused by differences between the coefficients of linear expansion of the first and second ground electrodes and the multilayer body can be reduced.

Furthermore, in a preferred embodiment of the electronic component, the electronic component further includes an electrostatic discharge element that is provided in the multilayer body, is connected to the primary coil and the secondary coil and is connected to the ground terminal.

In this preferred embodiment, since the electronic component further includes an electrostatic discharge element, countermeasures against static electricity can be taken for the primary coil and the secondary coil.

Other features, elements, characteristics and advantages of the present disclosure will become more apparent from the following detailed description of preferred embodiments of the present disclosure with reference to the attached drawings.

DETAILED DESCRIPTION

Hereafter, the present disclosure will be described in detail using illustrative embodiments.

First Embodiment

Figure 1:
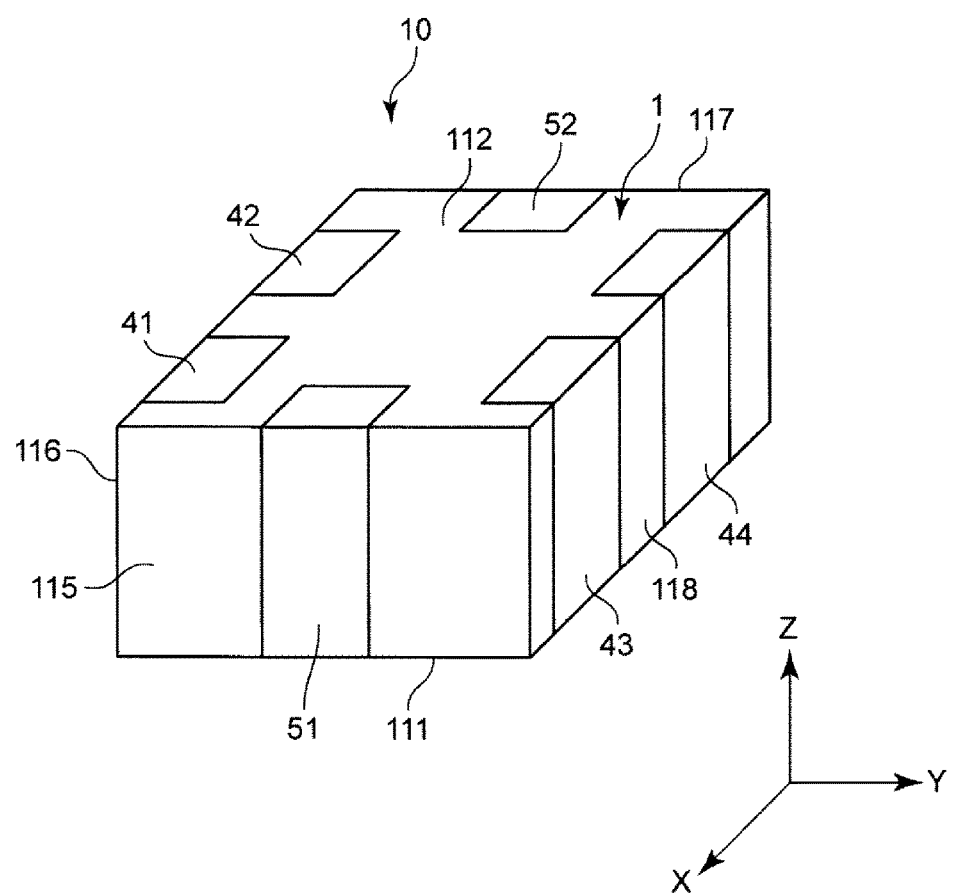
FIG. 1 is a perspective view illustrating an electronic component of a first embodiment of the present disclosure.
Figure 2:
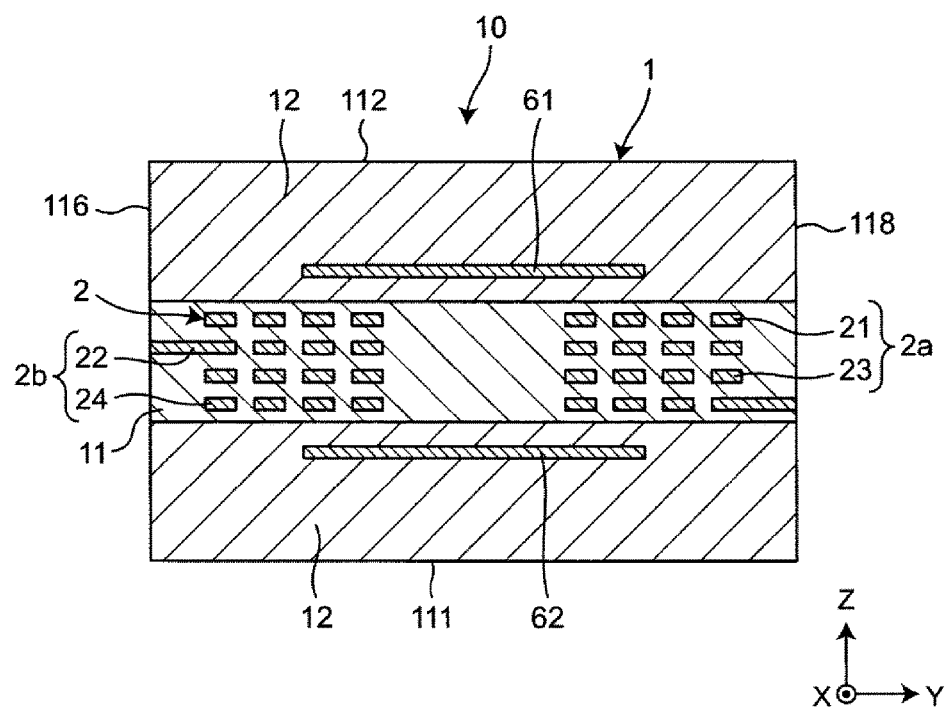
FIG. 2 is a YZ sectional view of the electronic component.
Figure 3:
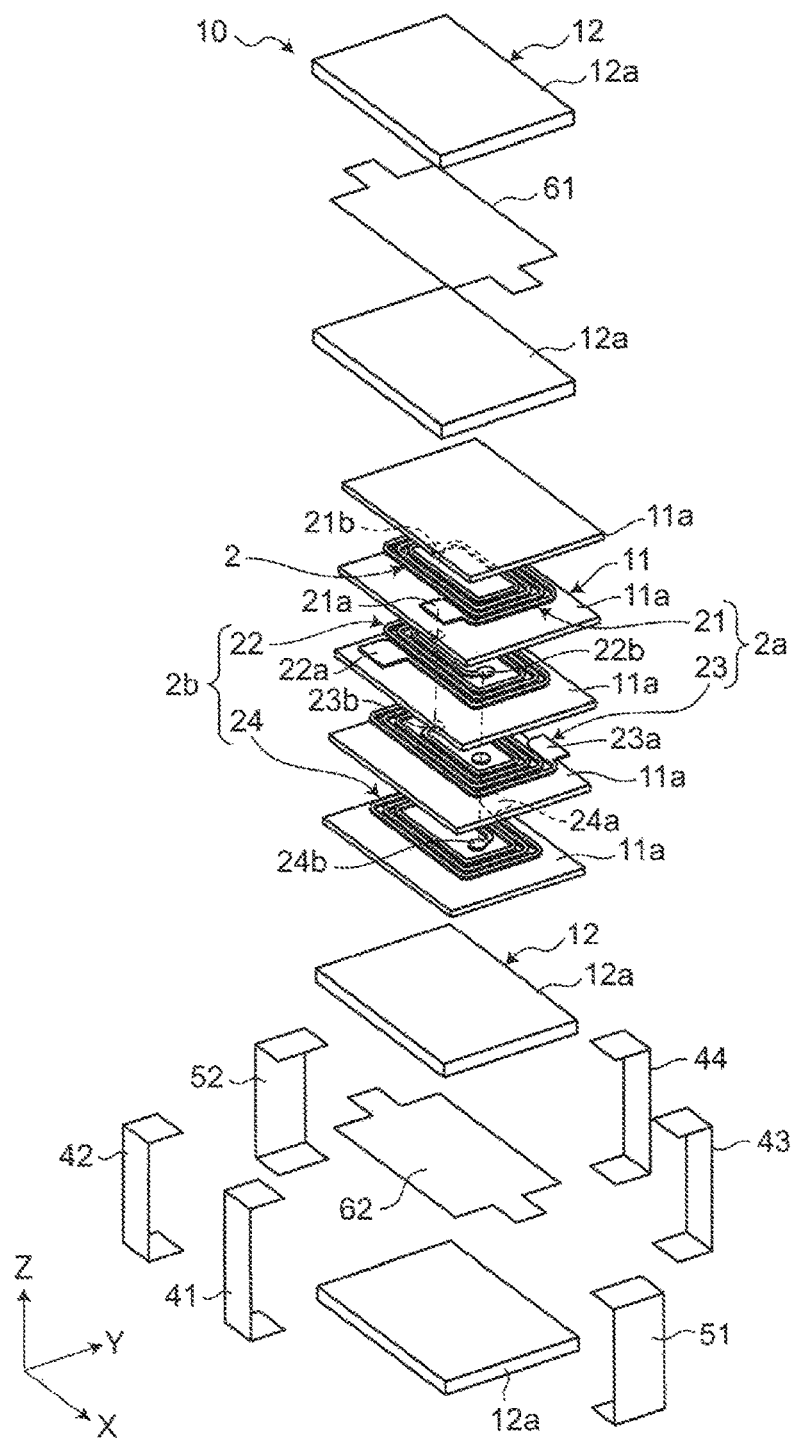
FIG. 3 is an exploded perspective view of the electronic component.

FIG. 1 is a perspective view illustrating an electronic component of a first embodiment of the present disclosure. FIG. 2 is a sectional view of the electronic component. FIG. 3 is an exploded perspective view of the electronic component. As illustrated in FIGS. 1 to 3, an electronic component 10 includes a multilayer body 1, a common mode choke coil 2 that is provided inside the multilayer body 1, first and second ground electrodes 61 and 62 that are provided inside the multilayer body 1, and first and second ground terminals 51 and 52 that are connected to the first and second ground electrodes 61 and 62.

The electronic component 10 is electrically connected to a mounting substrate. The electronic component 10 is mounted in an electronic appliance such as a personal computer, a DVD player, a digital camera, a TV, a cellular phone or an in-car electronic appliance, for example.

The multilayer body 1 includes a plurality of insulating layers that are stacked on top of one another. More specifically, the multilayer body 1 includes a non-magnetic body and magnetic bodies 12 that vertically sandwich the non-magnetic body 11 therebetween in the stacking direction. That is, the insulating layers include non-magnetic sheets 11a and magnetic sheets 12a. The non-magnetic body 11 is formed of a resin material, a glass material or a glass ceramic material, for example. The magnetic bodies 12 are composed of a magnetic material such as ferrite. The magnetic bodies 12 preferably include a metal magnetic powder, and when this is the case, the characteristics (inductance value, direct current superposition characteristics and so on) of the electronic component 10 can be improved.

The multilayer body 1 is formed in a substantially rectangular parallelepiped shape. A stacking direction of the multilayer body 1 is defined as a Z axis direction, a direction that extends along long edges of the multilayer body 1 is defined as an X axis direction and a direction that extends along short edges of the multilayer body 1 is defined as a Y axis direction. The X axis, the Y axis and the Z axis are orthogonal to one another. An upward direction in the figures is taken to be an upward Z axis direction and a downward direction in the figures is taken to be a downward Z axis direction.

Surfaces of the multilayer body 1 include a first end surface 111, a second end surface 112, a first side surface 115, a second side surface 116, a third side surface 117 and a fourth side surface 118. The first end surface 111 and the second end surface 112 are positioned on opposite sides in the stacking direction (Z axis direction). The first to fourth side surfaces 115 to 118 are positioned between the first end surface 111 and the second end surface 112.

The first end surface 111 is a mounting surface that is mounted on the mounting substrate and is positioned on the lower side. The first side surface 115 and the third side surface 117 are short side surfaces and are positioned on opposite sides in the X axis direction. The second side surface 116 and the fourth side surface 118 are long side surfaces and are positioned on opposite sides in the Y axis direction.

The common mode choke coil 2 includes a primary coil 2a and a secondary coil 2b, which are arranged inside the multilayer body 1 in the stacking direction. The primary coil 2a and the secondary coil 2b are arranged inside the non-magnetic body 11.

The primary coil 2a includes a first coil 21 and a third coil 23, which are electrically connected to each other. The secondary coil 2b includes a second coil 22 and a fourth coil 24, which are electrically connected to each other.

The first to fourth coils 21 to 24 are arranged in order from top to bottom. That is, the two coils 21 and 23 of the primary coil 2a and the two coils 22 and 24 of the secondary coil 2b are arranged in an alternating manner in the stacking direction. The first to fourth coils 21 to 24 are respectively provided on the non-magnetic sheets 11a. The first to fourth coils 21 to 24 are formed of a conductive material such as Ag, Ag—Pd, Cu or Ni, for example.

The first to fourth coils 21 to 24 include spiral patterns that are wound in a substantially spiral shape in the same direction when viewed from above. An outer peripheral end of the spiral shape of the first coil 21 has a lead out electrode 21a and the other end, which is in the center, of the spiral shape of the first coil 21 has a pad portion 21b. Similarly, the second coil 22 has a lead out electrode 22a and a pad portion 22b, the third coil 23 has a lead out electrode 23a and a pad portion 23b, and the fourth coil 24 has a lead out electrode 24a and a pad portion 24b.

The lead out electrode 21a of the first coil 21 is exposed from the first side surface 115 side of the second side surface 116. The lead out electrode 22a of the second coil 22 is exposed from the third side surface 117 side of the second side surface 116. The lead out electrode 23a of the third coil 23 is exposed from the first side surface 115 side of the fourth side surface 118. The lead out electrode 24a of the fourth coil 24 is exposed from the third side surface 117 side of the fourth side surface 118.

The pad portion 21b of the first coil 21 and the pad portion 23b of the third coil 23 are electrically connected to each other through a via conductor of the non-magnetic sheet 11a on which the second coil 22 is provided. The pad portion 22b of the second coil 22 and the pad portion 24b of the fourth coil 24 are electrically connected to each other through a via conductor of the non-magnetic sheet 11a on which the third coil 23 is provided.

The primary coil 2a and the secondary coil 2b are electrically connected to wiring lines on the mounting substrate via first to fourth coil terminals 41 to 44. The first to fourth coil terminals 41 to 44 are formed of a conductive material such as Ag, Ag—Pd, Cu or Ni, for example. The first to fourth coil terminals 41 to 44 are formed by applying the conductive material to the surfaces of the multilayer body 1 and then baking the conductive material, for example. The first to fourth coil terminals 41 to 44 are each formed in a substantially C-like shape.

The first coil terminal 41 is provided on a first side surface 115 side of the second side surface 116. One end portion of the first coil terminal 41 is folded over from the second side surface 116 so as to be provided on the first end surface 111. The other end portion of the first coil terminal 41 is folded over from the second side surface 116 so as to be provided on the second end surface 112. The first coil terminal is electrically connected to the lead out electrode 21a of the first coil 21.

The second coil terminal 42 is provided on a third side surface 117 side of the second side surface 116. The shape of the second coil terminal 42 is substantially the same as that of the first coil terminal 41 and therefore description thereof will be omitted. The second coil terminal 42 is electrically connected to the lead out electrode 22a of the second coil 22.

The third coil terminal 43 is provided on a first side surface 115 side of the fourth side surface 118. The shape of the third coil terminal 43 is substantially the same as that of the first coil terminal 41 and therefore description thereof will be omitted. The third coil terminal 43 is electrically connected to the lead out electrode 23a of the third coil 23.

The fourth coil terminal 44 is provided on a third side surface 117 side of the fourth side surface 118. The shape of the fourth coil terminal 44 is substantially the same as that of the first coil terminal 41 and therefore description thereof will be omitted. The fourth coil terminal 44 is electrically connected to the lead out electrode 24a of the fourth coil 24.

The first ground electrode 61 and the second ground electrode 62 are arranged such that the primary coil 2a and the secondary coil 2b are interposed therebetween in the stacking direction. The first ground electrode 61 is arranged inside the upper magnetic body 12. The second ground electrode 62 is arranged inside the lower magnetic body 12.

The first ground electrode 61 faces the first coil 21 of the primary coil 2a and a capacitance is generated between the first ground electrode 61 and the first coil 21. The second ground electrode 62 faces the fourth coil 24 of the secondary coil 2b and a capacitance is generated between the second ground electrode 62 and the fourth coil 24.

The first and second ground electrodes 61 and 62 are sandwiched between the magnetic sheets 12a. The first and second ground electrodes 61 and 62 are formed of a conductive material such as Ag, Ag—Pd, Cu or Ni, for example.

The first and second ground electrodes 61 and 62 are formed in substantially rectangular shapes and extend in the X axis direction. One end portion of each of the first and second ground electrodes 61 and 62 is exposed from the first side surface 115 and the other end portion of each of the first and second ground electrodes 61 and 62 is exposed from the third side surface 117. The first and second ground electrodes 61 and are superposed with the primary coil 2a and the secondary coil 2b when viewed in the stacking direction.

The first and second ground terminals 51 and 52 are formed of a conductive material such as Ag, Ag—Pd, Cu or Ni, for example. The first and second ground terminals 51 and 52 are formed by applying the conductive material to the surfaces of the multilayer body 1 and then baking the conductive material, for example. The first and second ground terminals 51 and 52 are each formed in a substantially C-like shape.

The first ground terminal 51 is provided on the first side surface 115. One end portion of the first ground terminal 51 is folded over from the first side surface 115 so as to be provided on the first end surface 111. The other end portion of the first ground terminal 51 is folded over from the first side surface 115 so as to be provided on the second end surface 112. The first ground terminal 51 electrically connects the one end portions of the first and second ground electrodes 61 and 62 and a ground wiring line on the mounting substrate.

The second ground terminal 52 is provided on the third side surface 117. The shape of the second ground terminal 52 is substantially the same as that of the first ground terminal 51 and therefore description thereof will be omitted. The second ground terminal 52 electrically connects the other end portions of the first and second ground electrodes 61 and 62 and a ground wiring line on the mounting substrate to each other.

Figure 4:
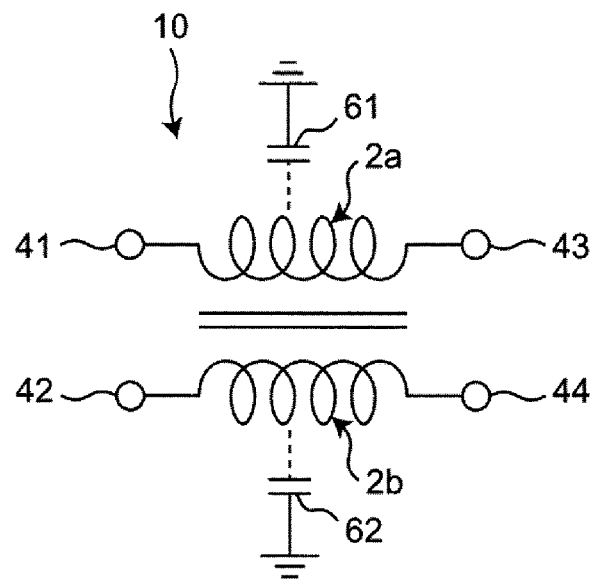
FIG. 4 is an equivalent circuit diagram of the electronic component.

FIG. 4 is an equivalent circuit diagram of the electronic component 10. As illustrated in FIG. 4, the primary coil 2a, which is made up of the first coil 21 and the third coil 23, is connected between the first coil terminal 41 and the third coil terminal 43. The first ground electrode 61 is arranged so as to face the primary coil 2a.

The secondary coil 2b, which is made up of the second coil 22 and the fourth coil 24, is connected between the second coil terminal 42 and the fourth coil terminal 44. The second ground electrode 62 is arranged so as to face the secondary coil 2b. In other words, a so-called T-type LC filter structure is formed as an equivalent circuit.

Next, a method of manufacturing the electronic component 10 will be described.

As illustrated in FIG. 3, the materials of the first to fourth coils 21 to 24 are applied to different non-magnetic sheets 11a by performing printing, for example. In addition, the materials of the first and second ground electrodes 61 and 62 are applied to different magnetic sheets 12a by performing printing, for example.

Then, the multilayer body 1 that includes the common mode choke coil 2 and the first and second ground electrodes 61 and 62 is obtained by stacking the non-magnetic sheets 11a, onto which the materials of the first to fourth coils 21 to 24 have been applied, and the magnetic sheets 12a, onto which the materials of the first and second ground electrodes 61 and 62 have been applied, on top of one another and performing firing.

Next, the first to fourth coil terminals 41 to 44 and the first and second ground terminals 51 and 52 are formed on the surfaces of the multilayer body 1 by applying the materials of the first to fourth coil terminals 41 to 44 to the surfaces of the multilayer body 1 by performing printing or the like, applying the materials of the first and second ground terminals 51 and 52 to the surfaces of the multilayer body 1 by performing printing or the like and then baking these materials. Thus, the electronic component 10 is manufactured.

In the electronic component 10, the first ground electrode 61 and the second ground electrode 62 are arranged such that the primary coil 2a and the secondary coil 2b are interposed therebetween in the stacking direction, and a capacitance is generated between the first ground electrode 61 and the primary coil 2a and a capacitance is generated between the second ground electrode 62 and the secondary coil 2b.

Thus, as a result of a capacitance being generated between the first ground electrode 61 and the primary coil 2a and a capacitance being generated between the second ground electrode 62 and the secondary coil 2b, a so-called T-type LC filter structure is formed as an equivalent circuit. Therefore, resonance can be obtained with smaller capacitance values than in the π-type LC filter structure of the related art and a reduction in signal quality can be suppressed by reducing degradation of the signal transmission characteristic Sdd21.

In addition, since the first ground electrode 61 and the second ground electrode 62 are arranged outside the primary coil 2a and the secondary coil 2b, the first and second ground electrodes 61 and 62 are not located inside the primary and secondary coils 2a and 2b. Therefore, the first and second ground electrodes 61 and 62 and the primary and secondary coils 2a and 2b (in particular, the via conductors provided in the non-magnetic sheets 11a), which are at different potentials, are not located in the same layers and therefore electrochemical migration caused by a potential difference between the first and second ground electrodes 61 and 62 and the primary and secondary coils 2a and 2b can be prevented.

Furthermore, since the common mode choke coil 2 and the first and second ground electrodes 61 and 62 are used in combination with each other, high Scc21 attenuation can be achieved over a wide band compared with a simple common mode choke coil. That is, attenuation of Scc21, which represents a noise removal effect, is increased and excellent characteristics are obtained.

In the electronic component 10, a capacitance is generated between the first ground electrode 61 and the primary coil 2a and a capacitance is generated between the second ground electrode 62 and the secondary coil 2b. Thus, good balance can be achieved between the attenuation characteristics of the primary coil 2a and the secondary coil 2b and the overall noise suppression effect can be improved.

Since the two coils 21 and 23 of the primary coil 2a and the two coils 22 and 24 of the secondary coil 2b are arranged in an alternating manner in the stacking direction in the electronic component 10, stray capacitances inside the primary and secondary coils 2a and 2b can be reduced and the electronic component 10 is able to handle high frequencies. In addition, since the capacitances between the coils and ground electrodes can be obtained in an equal and well-balanced manner by using the primary and secondary coils 2a and 2b, attenuation can be achieved through appropriate LC resonance.

In the electronic component 10, the primary coil 2a and the secondary coil 2b are arranged inside the non-magnetic body 11 and the non-magnetic body 11 is vertically sandwiched between the magnetic bodies 12 and therefore the magnetic flux of the coils 2a and 2b is concentrated in the upper and lower magnetic bodies 12. Consequently, magnetic flux that flows around the individual coils is decreased and shared magnetic flux that flows around the primary coil 2a and the secondary coil 2b is increased. Consequently, coupling between the primary coil 2a and the secondary coil 2b can be strengthened, and therefore high impedance can be achieved and degradation of the signal transmission characteristic Sdd21 can be reduced.

In the electronic component 10, the first ground electrode 61 is arranged inside the upper magnetic body 12 and the second ground electrode 62 is arranged inside the lower magnetic body 12. Thus, the first ground electrode 61 and the second ground electrode 62 can be arranged in the magnetic bodies 12, which are different bodies to the non-magnetic body in which the primary coil 2a and the secondary coil 2b are arranged, and an increase in stress in the non-magnetic body 11 caused by the electrodes being concentrated in the non-magnetic body 11 is relaxed and the occurrence of structural defects and a decrease in reliability can be suppressed.

Second Embodiment

Figure 5A:
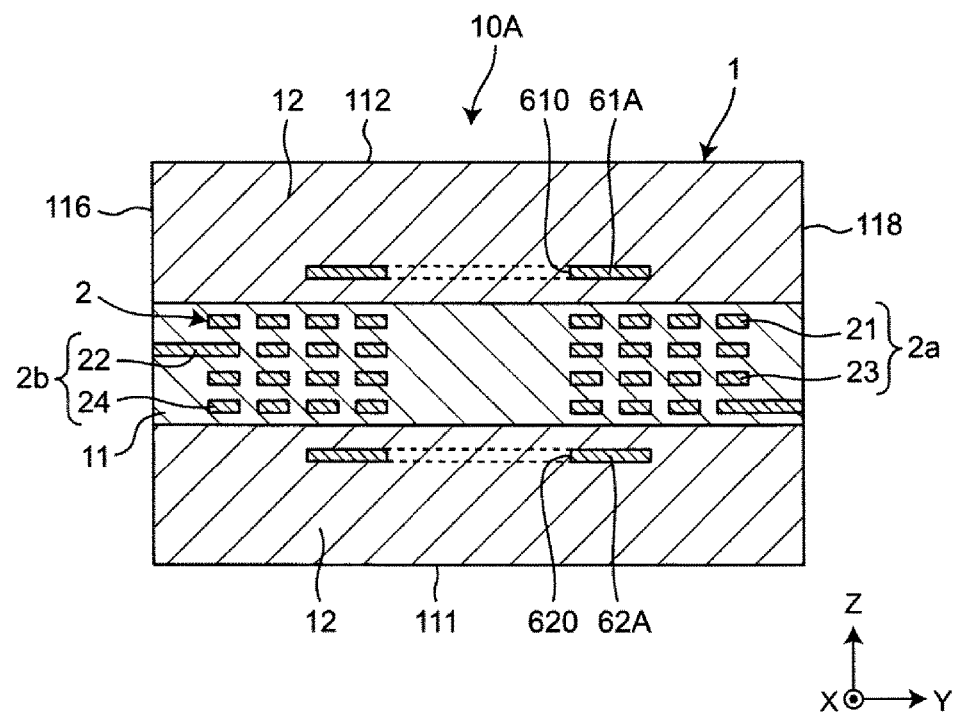
FIG. 5A is a YZ sectional view illustrating a second embodiment of an electronic component of the present disclosure.
Figure 5B:
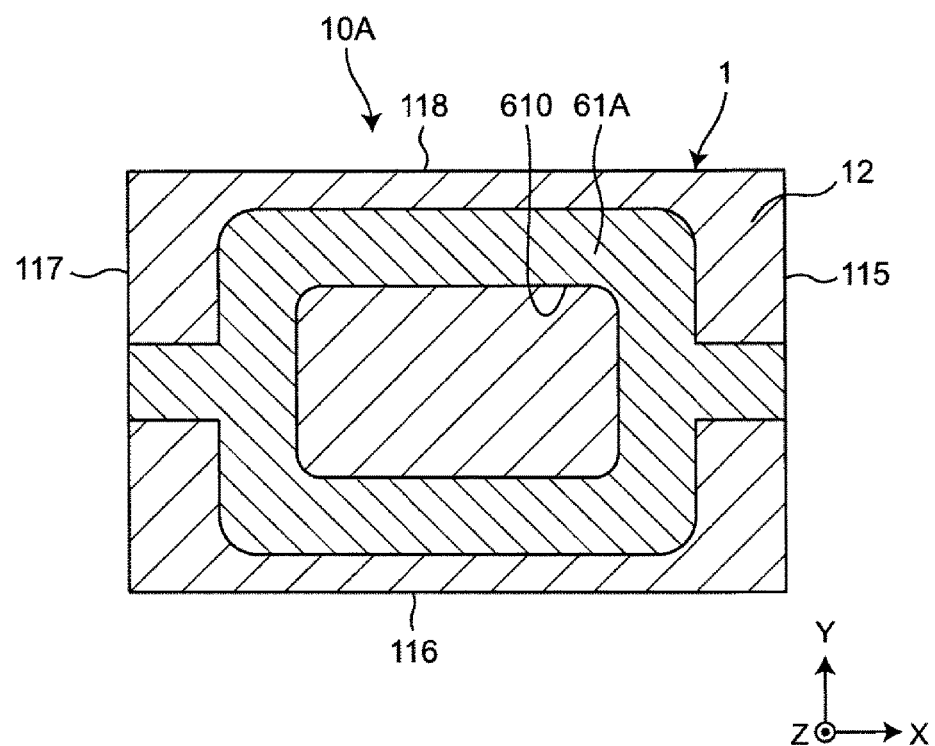
FIG. 5B is an XY sectional view of the electronic component.

FIG. 5A is a YZ sectional view illustrating a second embodiment of an electronic component of the present disclosure. FIG. 5B is an XY sectional view illustrating the second embodiment of an electronic component of the present disclosure. The second embodiment differs from the first embodiment in terms of the configurations of the first and second ground electrodes. Only these different configurations will be described below. In the second embodiment, the same symbols as in the first embodiment are used to denote constituent parts that are the same as in the first embodiment and therefore description of those constituent parts will be omitted.

As illustrated in FIGS. 5A and 5B, in an electronic component 10A of the second embodiment, a first ground electrode 61A and a second ground electrode 62A are superposed with the primary coil 2a and the secondary coil 2b and are not superposed with an inner diameter part of the primary coil 2a and an inner diameter part of the secondary coil 2b when viewed in the stacking direction.

More specifically, the first ground electrode 61A has an inner diameter part 610 that is substantially the same size as an inner diameter part of the first coil 21 that faces the first ground electrode 61A when viewed in the stacking direction. The inner diameter part 610 of the first ground electrode 61A is superposed with the inner diameter part of the first coil 21 when viewed in plan. The inner diameter parts of the first to fourth coils 21 to 24 all have substantially the same size when viewed in the stacking direction. Similarly, the second ground electrode 62A has an inner diameter part 620 that is substantially the same size as the inner diameter part of the fourth coil 24 that faces the second ground electrode 62A when viewed in the stacking direction.

In the electronic component 10A, the first ground electrode 61A and the second ground electrode 62A are not superposed with an inner diameter part of the primary coil 2a and an inner diameter part of the secondary coil 2b when viewed in the stacking direction. Consequently, magnetic flux of the primary coil 2a and the secondary coil 2b is not blocked by the first ground electrode 61A and the second ground electrode 62A and degradation of characteristics caused by the effect of loss of magnetic flux can be suppressed.

Third Embodiment

Figure 6A:
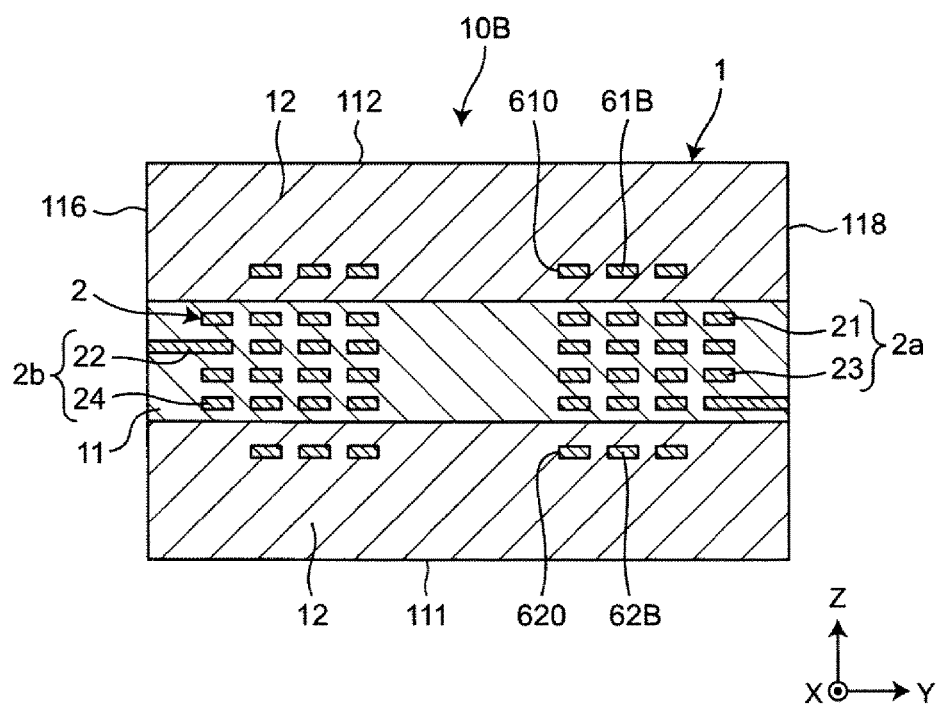
FIG. 6A is a YZ sectional view illustrating a third embodiment of an electronic component of the present disclosure.
Figure 6B:
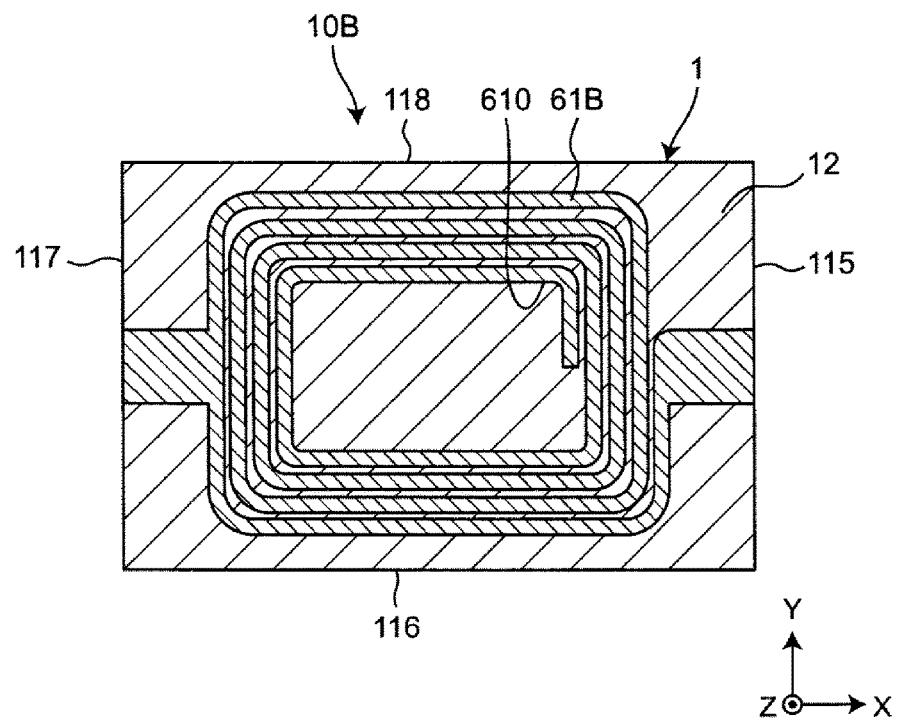
FIG. 6B is an XY sectional view of the electronic component.

FIG. 6A is a YZ sectional view illustrating a third embodiment of an electronic component of the present disclosure. FIG. 6B is an XY sectional view illustrating the third embodiment of an electronic component of the present disclosure. The third embodiment differs from the second embodiment in terms of the configurations of first and second ground electrodes 61B and 62B. Only these different configurations will be described below. In the third embodiment, the same symbols as in the second embodiment are used to denote constituent parts that are the same as in the second embodiment and therefore description of those constituent parts will be omitted.

As illustrated in FIGS. 6A and 6B, in an electronic component 10B of the third embodiment, the first ground electrode 61B and the second ground electrode 62B have similar patterns to facing coils, which are coils that respectively face the first ground electrode 61B and the second ground electrode 62B, among the coils of the primary coil 2a and the secondary coil 2b when viewed in the stacking direction.

More specifically, the first ground electrode 61B has a similar pattern to the facing first coil 21 when viewed in the stacking direction. That is, the pattern of the first ground electrode 61B has a substantially spiral shape that has substantially the same inner diameter, line width and line separation as the first coil 21 and is arranged at such a position as to be superposed with the pattern of the first coil 21 when viewed in the stacking direction. Similarly, the second ground electrode 62B has a similar pattern to the facing fourth coil 24 when viewed in the stacking direction.

In the electronic component 10B, the first ground electrode 61B and the second ground electrode 62B respectively have similar patterns to the facing coils among the coils of the primary coil 2a and the secondary coil 2b when viewed in the stacking direction. Consequently, the surface areas of the first and second ground electrodes 61B and 62B can be reduced to the minimum and the capacitances can be efficiently obtained. In addition, since the surface areas of the first and second ground electrodes 61B and 62B can be reduced, the generation of stress caused by differences between the coefficients of linear expansion of the first and second ground electrodes 61B and 62B and the multilayer body 1 can be reduced.

Fourth Embodiment

Figure 7:
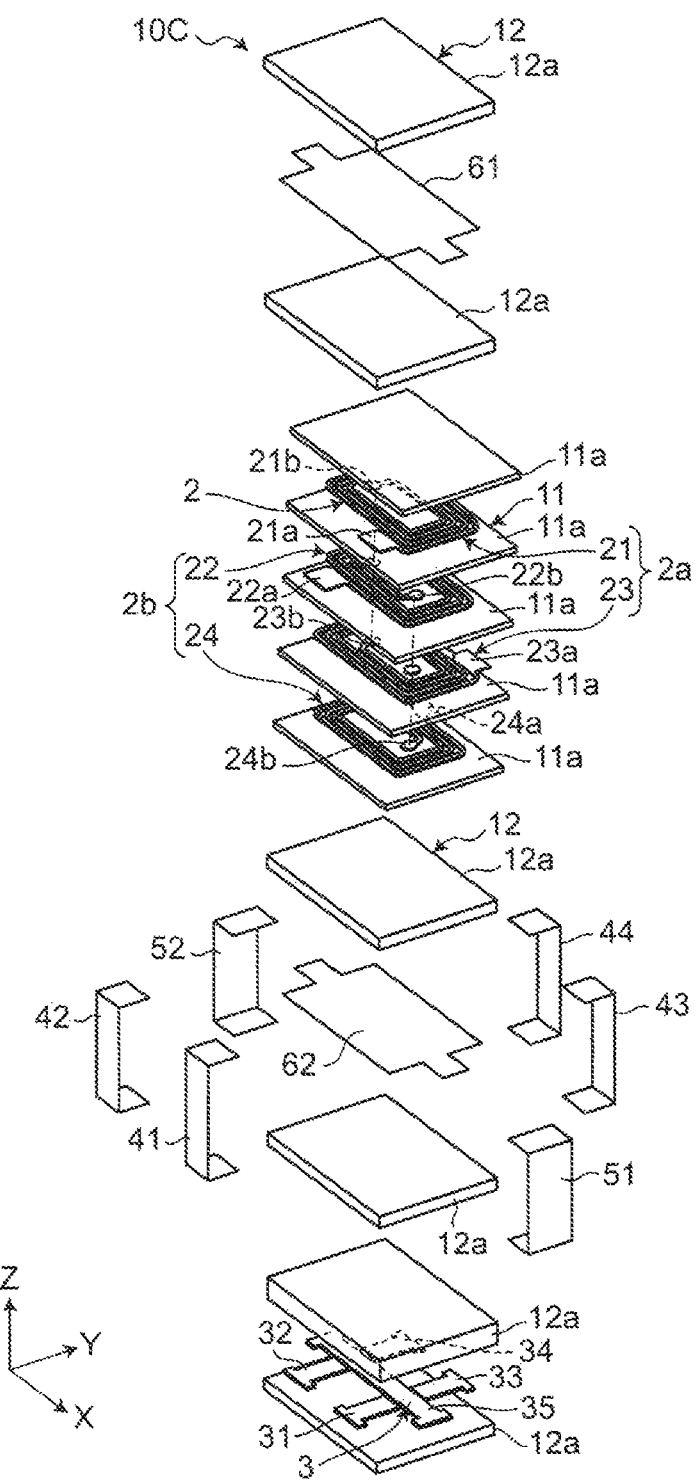
FIG. 7 is a perspective view illustrating an electronic component of a fourth embodiment of the present disclosure.

FIG. 7 is a perspective view illustrating a fourth embodiment of an electronic component of the present disclosure. The fourth embodiment differs from the first embodiment in that the fourth embodiment includes an electrostatic discharge element. Only this difference will be described below. In the fourth embodiment, the same symbols as in the first embodiment are used to denote constituent parts that are the same as in the first embodiment and therefore description of those constituent parts will be omitted.

As illustrated in FIG. 7, an electronic component 10C of the fourth embodiment includes an electrostatic discharge (ESD) element 3. The electrostatic discharge element 3 is provided in the multilayer body 1 and is positioned closer to the lower side than the second ground electrode 62. The electrostatic discharge element 3 is connected to the primary coil 2a and the secondary coil 2b via the first to fourth coil terminals 41 to 44 and is connected to ground via the first and second ground terminals 51 and 52.

The electrostatic discharge element 3 includes first to fifth discharge electrodes 31 to 35. The first to fifth discharge electrodes 31 to 35 are sandwiched between upper and lower magnetic sheets 12a. The first to fourth discharge electrodes 31 to 34 extend in the Y axis direction. The fifth discharge electrode 35 extends in the X axis direction.

One end portion of the first discharge electrode 31 is exposed from the first side surface 115 side of the second side surface 116 and the other end portion of the first discharge electrode 31 is positioned in the center of the magnetic body 12 in the Y direction. One end portion of the second discharge electrode 32 is exposed from the third side surface 117 side of the second side surface 116 and the other end portion of the second discharge electrode 32 is positioned in the center of the magnetic body 12 in the Y direction.

One end portion of the third discharge electrode 33 is exposed from the first side surface 115 side of the fourth side surface 118 and the other end portion of the third discharge electrode 33 is positioned in the center of the magnetic body 12 in the Y direction. One end portion of the fourth discharge electrode 34 is exposed from the third side surface 117 side of the fourth side surface 118 and the other end portion of the fourth discharge electrode 34 is positioned in the center of the magnetic body 12 in the Y direction.

One end portion of the fifth discharge electrode 35 is positioned in a gap between the other end portion of the first discharge electrode 31 and the other end portion of the third discharge electrode 33. A discharge gap is provided between the one end portion of the fifth discharge electrode 35 and the other end portion of the first discharge electrode 31. A discharge gap is provided between the one end portion of the fifth discharge electrode 35 and the other end portion of the third discharge electrode 33.

The other end portion of the fifth discharge electrode 35 is positioned in a gap between the other end portion of the second discharge electrode 32 and the other end portion of the fourth discharge electrode 34. A discharge gap is provided between the other end portion of the fifth discharge electrode 35 and the other end portion of the second discharge electrode 32. A discharge gap is provided between the other end portion of the fifth discharge electrode 35 and the other end portion of the fourth discharge electrode 34.

The one end portion of the fifth discharge electrode 35 is exposed from the first side surface 115. The other end portion of the fifth discharge electrode 35 is exposed from the third side surface 117.

There may be no material in the discharge gaps or the discharge gaps may be filled with a material that readily discharges. Examples of a material that readily discharges include coated particles and semiconductor particles. Coated particles are particles obtained by coating the surfaces of metal particles such as Cu particles with an inorganic material such as alumina. Semiconductor particles are particles of a semiconductor material such as SiC. It is preferable that the coated particles and the semiconductor particles be arranged in a dispersed manner. By dispersing the coated particles and the semiconductor particles, it is easy to prevent shorts and adjust ESD characteristics such as the discharge start voltage.

The one end portion of the first discharge electrode 31 is electrically connected to the lead out electrode 21a of the first coil 21 via the first coil terminal 41. The one end portion of the second discharge electrode 32 is electrically connected to the lead out electrode 22a of the second coil 22 via the second coil terminal 42.

The one end portion of the third discharge electrode 33 is electrically connected to the lead out electrode 23a of the third coil 23 via the third coil terminal 43. The one end portion of the fourth discharge electrode 34 is electrically connected to the lead out electrode 24a of the fourth coil 24 via the fourth coil terminal 44.

The one end portion of the fifth discharge electrode 35 is electrically connected to a ground wiring line on the mounting substrate via the first ground terminal 51. The other end portion of the fifth discharge electrode 35 is electrically connected to a ground wiring line on the mounting substrate via the second ground terminal 52.

Figure 8:
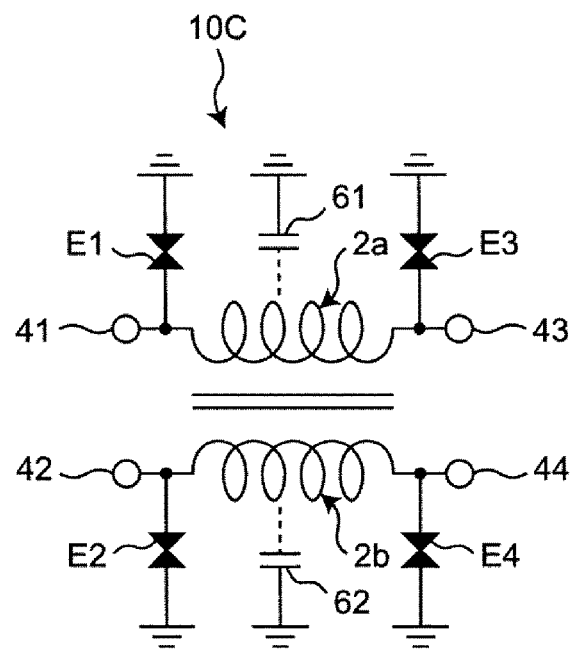
FIG. 8 is an equivalent circuit diagram of the electronic component.
Figure 9:
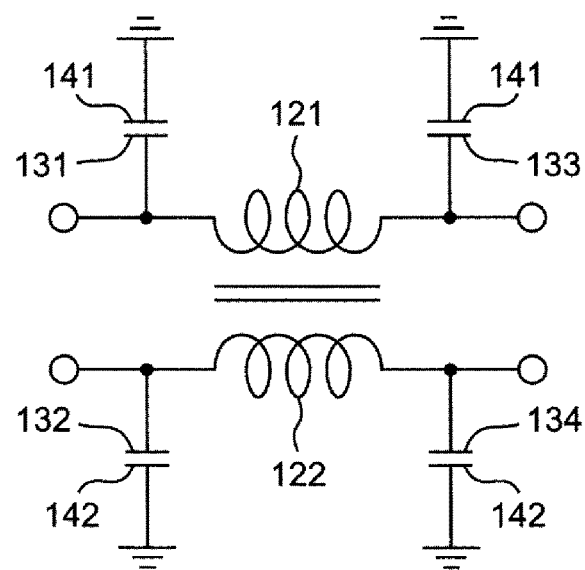
FIG. 9 is an equivalent circuit diagram of an electronic component of the related art.

FIG. 8 is an equivalent circuit diagram of the electronic component 10C. As illustrated in FIG. 8, a first discharge part E1, which is made up of the first discharge electrode 31 and the fifth discharge electrode 35, is connected between the primary coil 2a and the first coil terminal 41. A third discharge part E3, which is made up of the third discharge electrode 33 and the fifth discharge electrode 35, is connected between the primary coil 2a and the third coil terminal 43.

A second discharge part E2, which is made up of the second discharge electrode 32 and the fifth discharge electrode 35, is connected between the secondary coil 2b and the second coil terminal 42. A fourth discharge part E4, which is made up of the fourth discharge electrode 34 and the fifth discharge electrode 35, is connected between the secondary coil 2b and the fourth coil terminal 44.

Since the electronic component 10C includes the electrostatic discharge element 3, countermeasures against static electricity can be taken for the primary coil 2a and the secondary coil 2b. That is, an ESD is generated by the electrostatic discharge element 3, and the ESD can be distributed to ground via the first and second ground terminals 51 and 52 and an ESD voltage flowing to a signal line can be reduced.

The present disclosure is not limited to the above-described embodiments and design changes can be made within a range that does not depart from the gist of the present disclosure. For example, the characteristic features of the first to fourth embodiments may be combined with each other in various ways.

In the embodiments, the primary coil and the secondary coil are each formed of two coils, but at least either of the primary coil and the secondary coil may be formed of one or three or more coils.

Regarding the arrangement of the first and third coils, which form the primary coil, and the second and fourth coils, which form the secondary coil, the coils are arranged in the order of first coil, second coil, third coil, fourth coil from top to bottom in the above-described embodiments, but the coils may be arranged in the order of first coil, third coil, second coil, fourth coil, may be arranged in the order of first coil, second coil, fourth coil, third coil or may be arranged in the order of second coil, first coil, third coil, fourth coil.

Although the first ground electrode faces the primary coil and the second ground electrode faces the secondary coil in the above-described embodiments, depending on the arrangement of the primary and secondary coils, the first and second ground electrodes may face the primary coil, the first and second ground electrodes may face the secondary coil, or the first ground electrode may face the secondary coil and the second ground electrode may face the primary coil. That is, a capacitance is generated between the first ground electrode and the primary coil or the secondary coil and a capacitance is generated between the second ground electrode and the primary coil or the secondary coil.

The first and second ground electrodes are arranged inside the magnetic bodies in the above-described embodiments, but the first and second ground electrodes may instead be arranged inside the non-magnetic body.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. An electronic component comprising:
a multilayer body that includes a plurality of insulating layers that are stacked on top of one another;
a primary coil and a secondary coil that are arranged inside the multilayer body in a stacking direction of the multilayer body;
a first ground electrode and a second ground electrode that are provided in the multilayer body and between which the primary coil and the secondary coil are interposed in the stacking direction; and
a ground terminal that is connected to the first ground electrode and the second ground electrode, wherein
a capacitance is generated between the first ground electrode and the primary coil or the secondary coil and a capacitance is generated between the second ground electrode and the primary coil or the secondary coil,
the first ground electrode faces one of the primary coil and the secondary coil and the second ground electrode faces the other of the primary coil and the secondary coil, and the primary coil includes two coils that are electrically connected to each other, the secondary coil includes two coils that are electrically connected to each other and the two coils of the primary coil and the two coils of the secondary coil are arranged in an alternating manner in the stacking direction.

2. The electronic component according to claim 1, wherein the multilayer body includes a non-magnetic body and upper and lower magnetic bodies that vertically sandwich the non-magnetic body therebetween in the stacking direction, and the primary coil and the secondary coil are arranged inside the non-magnetic body.

3. The electronic component according to claim 2, wherein the first ground electrode is arranged inside one magnetic body among the upper and lower magnetic bodies and the second ground electrode is arranged inside the other magnetic body among the upper and lower magnetic bodies.

4. The electronic component according to claim 1, wherein the first ground electrode and the second ground electrode are superposed with the primary coil and the secondary coil and are not superposed with an inner diameter part of the primary coil and an inner diameter part of the secondary coil when viewed in the stacking direction.

5. The electronic component according to claim 4, wherein a pattern of the first ground electrode and a pattern of the second ground electrode have spiral shapes that have the same line widths and line separations as facing coils, which are coils that respectively face the first ground electrode and the second ground electrode, among coils of the primary coil and the secondary coil and the pattern of the first ground electrode and the pattern of the second ground electrode are arranged at such positions as to be superposed with the patterns of the facing coils when viewed in the stacking direction.

6. The electronic component according to claim 1, further comprising:
an electrostatic discharge element that is provided in the multilayer body, is connected to the primary coil and the secondary coil and is connected to the ground terminal.

7. An electronic component comprising:
a multilayer body that includes a plurality of insulating layers that are stacked on top of one another;
a primary coil and a secondary coil that are arranged inside the multilayer body in a stacking direction of the multilayer body;
a first ground electrode and a second ground electrode that are provided in the multilayer body and between which the primary coil and the secondary coil are interposed in the stacking direction; and
a ground terminal that is connected to the first ground electrode and the second ground electrode, wherein
a capacitance is generated between the first ground electrode and the primary coil or the secondary coil and a capacitance is generated between the second ground electrode and the primary coil or the secondary coil, and
the first ground electrode and the second ground electrode are superposed with the primary coil and the secondary coil and are not superposed with an inner diameter part of the primary coil and an inner diameter part of the secondary coil when viewed in the stacking direction.

8. The electronic component according to claim 7,
wherein the first ground electrode faces one of the primary coil and the secondary coil and the second ground electrode faces the other of the primary coil and the secondary coil.

9. The electronic component according to claim 8,
wherein the primary coil includes two coils that are electrically connected to each other, the secondary coil includes two coils that are electrically connected to each other and the two coils of the primary coil and the two coils of the secondary coil are arranged in an alternating manner in the stacking direction.

10. The electronic component according to claim 7,
wherein the multilayer body includes a non-magnetic body and upper and lower magnetic bodies that vertically sandwich the non-magnetic body therebetween in the stacking direction, and the primary coil and the secondary coil are arranged inside the non-magnetic body.

11. The electronic component according to claim 10,
wherein the first ground electrode is arranged inside one magnetic body among the upper and lower magnetic bodies and the second ground electrode is arranged inside the other magnetic body among the upper and lower magnetic bodies.

12. The electronic component according to claim 7,
wherein a pattern of the first ground electrode and a pattern of the second ground electrode have spiral shapes that have the same line widths and line separations as facing coils, which are coils that respectively face the first ground electrode and the second ground electrode, among coils of the primary coil and the secondary coil and the pattern of the first ground electrode and the pattern of the second ground electrode are arranged at such positions as to be superposed with the patterns of the facing coils when viewed in the stacking direction.

13. The electronic component according to claim 7, further comprising:
an electrostatic discharge element that is provided in the multilayer body, is connected to the primary coil and the secondary coil and is connected to the ground terminal.

* * * * *